United States Patent
Oganesian

(10) Patent No.: US 9,373,660 B2
(45) Date of Patent: Jun. 21, 2016

(54) METHOD OF FORMING A LOW PROFILE IMAGE SENSOR PACKAGE WITH AN IMAGE SENSOR SUBSTRATE, A SUPPORT SUBSTRATE AND A PRINTED CIRCUIT BOARD

(71) Applicant: Optiz, Inc., Palo Alto, CA (US)

(72) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/881,075

(22) Filed: Oct. 12, 2015

(65) Prior Publication Data

US 2016/0035785 A1  Feb. 4, 2016

Related U.S. Application Data

(62) Division of application No. 14/276,023, filed on May 13, 2014, now Pat. No. 9,196,650, which is a division of application No. 13/609,002, filed on Sep. 10, 2012, now Pat. No. 8,759,930.

(51) Int. Cl.
  *H01L 27/146* (2006.01)
(52) U.S. Cl.
  CPC ...... *H01L 27/14687* (2013.01); *H01L 27/1464* (2013.01); *H01L 27/14618* (2013.01); *H01L 27/14627* (2013.01); *H01L 27/14683* (2013.01); *H01L 27/14685* (2013.01); *H01L 2224/16* (2013.01); *H01L 2224/48091* (2013.01)
(58) Field of Classification Search
  None
  See application file for complete search history.

(56) References Cited

U.S. PATENT DOCUMENTS

| | | |
|---|---|---|
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |

(Continued)

FOREIGN PATENT DOCUMENTS

| | | |
|---|---|---|
| CN | 101217156 A | 7/2008 |
| JP | 2012059832 A | 3/2012 |

(Continued)

OTHER PUBLICATIONS

Notice of Allowance dated Apr. 28, 2015 corresponding to the related Korean Patent Application No. 10-2013-0095380.

(Continued)

*Primary Examiner* — Bilkis Jahan
(74) *Attorney, Agent, or Firm* — DLA Piper LLP (US)

(57) ABSTRACT

An image sensor package, and method of making same, that includes a printed circuit board having a first substrate with an aperture extending therethrough, one or more circuit layers, and a plurality of first contact pads electrically coupled to the one or more circuit layers. A sensor chip mounted to the printed circuit board and disposed at least partially in the aperture. The sensor chip includes a second substrate, a plurality of photo detectors formed on or in the second substrate, and a plurality of second contact pads formed at the surface of the second substrate which are electrically coupled to the photo detectors. Electrical connectors each electrically connect one of the first contact pads and one of the second contact pads. A lens module is mounted to the printed circuit board and has one or more lenses disposed for focusing light onto the photo detectors.

10 Claims, 23 Drawing Sheets

(56) References Cited

U.S. PATENT DOCUMENTS

| | | |
|---|---|---|
| 7,456,901 B2 | 11/2008 | Jeong et al. |
| 7,495,341 B2 | 2/2009 | Zilber et al. |
| 7,569,409 B2 | 8/2009 | Lin et al. |
| 7,589,422 B2 | 9/2009 | Lee et al. |
| 7,642,629 B2 | 1/2010 | Zilber et al. |
| 7,664,390 B2 | 2/2010 | Cho et al. |
| 7,859,033 B2 | 12/2010 | Brady |
| 8,471,311 B2 | 6/2013 | Lee et al. |
| 8,513,756 B2 * | 8/2013 | Suzuki ............. H01L 27/14618 257/432 |
| 2004/0251525 A1 | 12/2004 | Zilber |
| 2005/0104179 A1 | 5/2005 | Zilber |
| 2005/0205977 A1 | 9/2005 | Zilber |
| 2007/0138498 A1 | 6/2007 | Zilber |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 * | 5/2008 | Oganesian ......... H01L 23/3114 257/693 |
| 2008/0116544 A1 | 5/2008 | Grinman |
| 2008/0116545 A1 | 5/2008 | Grinman |
| 2008/0150121 A1 | 6/2008 | Oganesian |
| 2008/0185671 A1 | 8/2008 | Huang et al. |
| 2008/0246136 A1 * | 10/2008 | Haba .................. H01L 23/3128 257/686 |
| 2008/0265350 A1 * | 10/2008 | Wu .................... H01L 31/0203 257/432 |
| 2009/0026567 A1 | 1/2009 | Chen et al. |
| 2009/0115047 A1 | 5/2009 | Haba |
| 2009/0160065 A1 | 6/2009 | Haba |
| 2009/0212381 A1 | 8/2009 | Crisp |
| 2010/0053407 A1 | 3/2010 | Crisp |
| 2010/0200898 A1 | 8/2010 | Lin et al. |
| 2010/0225006 A1 | 9/2010 | Haba |
| 2010/0230812 A1 | 9/2010 | Oganesian |
| 2010/0237452 A1 | 9/2010 | Hagiwara et al. |
| 2010/0244171 A1 | 9/2010 | Nagamatsu et al. |
| 2011/0012259 A1 | 1/2011 | Grinman |
| 2011/0031629 A1 | 2/2011 | Haba |
| 2011/0033979 A1 | 2/2011 | Haba |
| 2011/0044367 A1 * | 2/2011 | Budd .................. G02B 6/4201 372/50.21 |
| 2011/0044369 A1 * | 2/2011 | Andry ................ G02B 6/4204 372/50.124 |
| 2011/0049696 A1 | 3/2011 | Haba |
| 2011/0057279 A1 | 3/2011 | Lee et al. |
| 2011/0147871 A1 * | 6/2011 | Utsumi ................ H01L 21/561 257/432 |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0043635 A1 * | 2/2012 | Yang .................... H01L 24/24 257/432 |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |

FOREIGN PATENT DOCUMENTS

| | | |
|---|---|---|
| KR | 100775136 B1 | 11/2007 |
| KR | 1020110120429 A | 11/2011 |
| KR | 101142347 B1 | 7/2012 |

OTHER PUBLICATIONS

U.S. Appl. No. 13/157,193, filed Jun. 9, 2011, Oganesian, Vage.
U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.

* cited by examiner

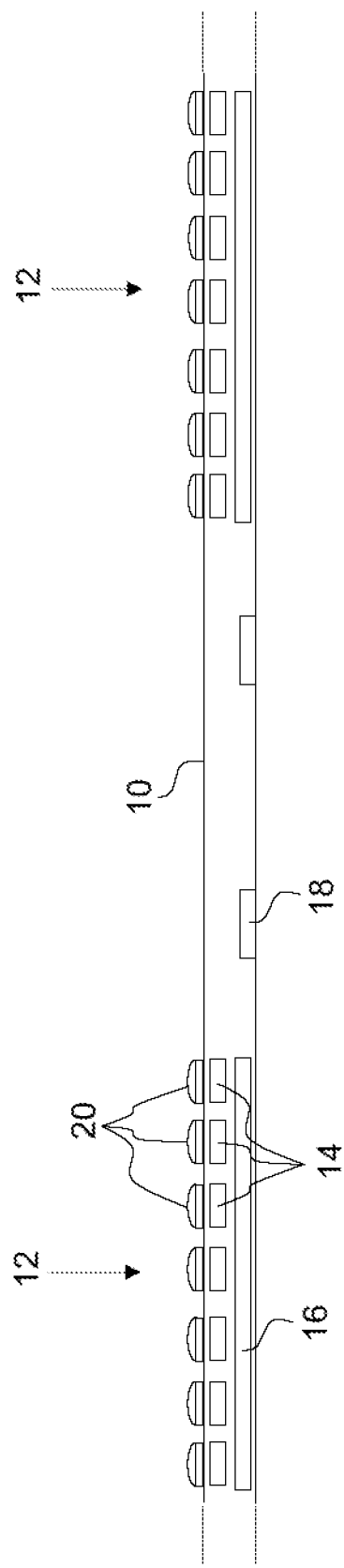

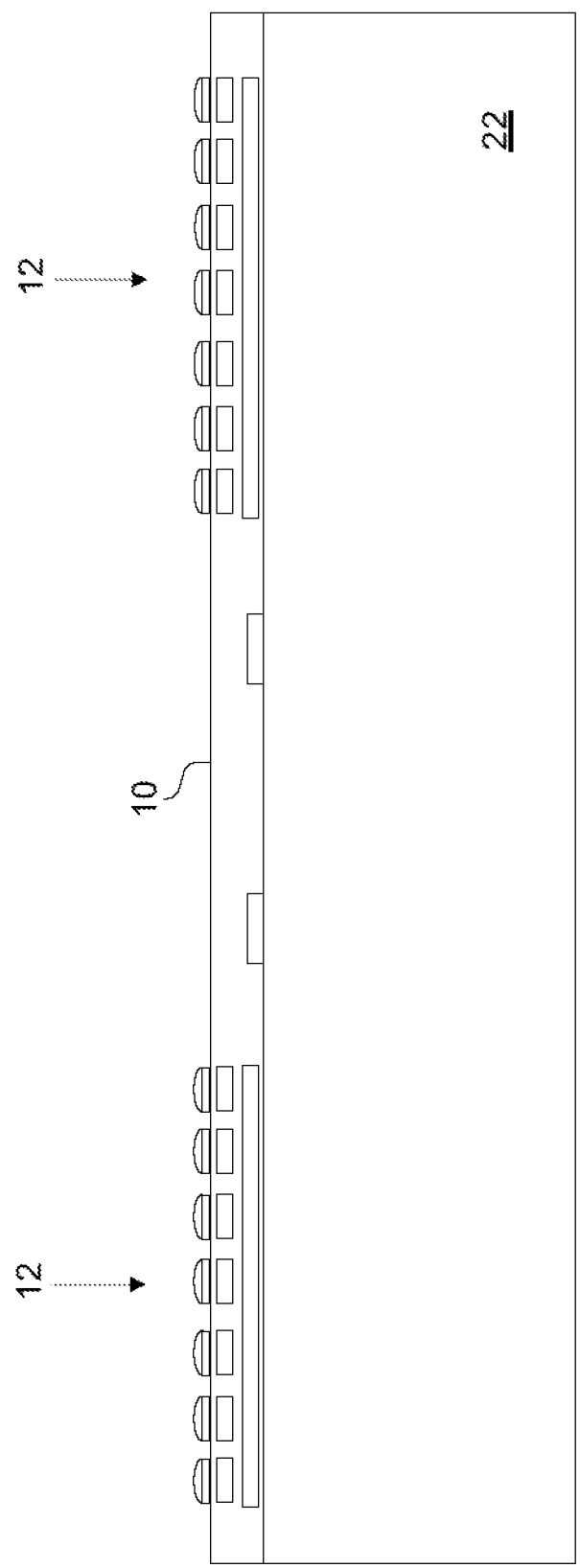

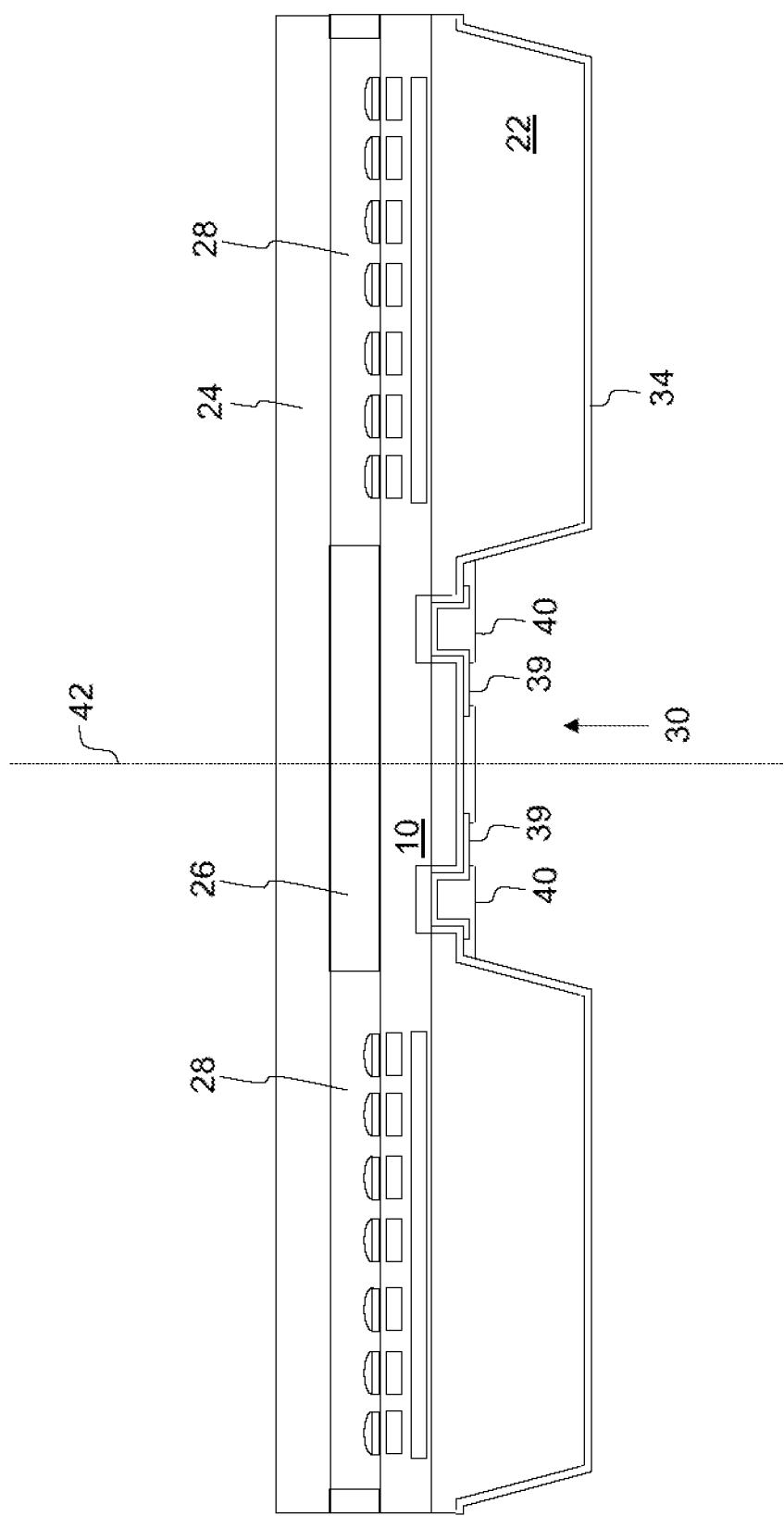

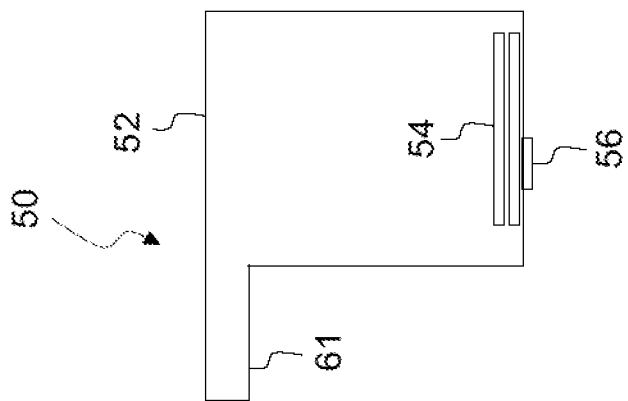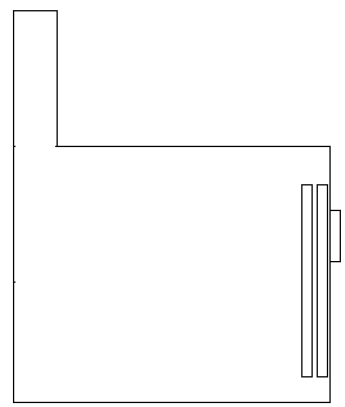
FIG. 2A

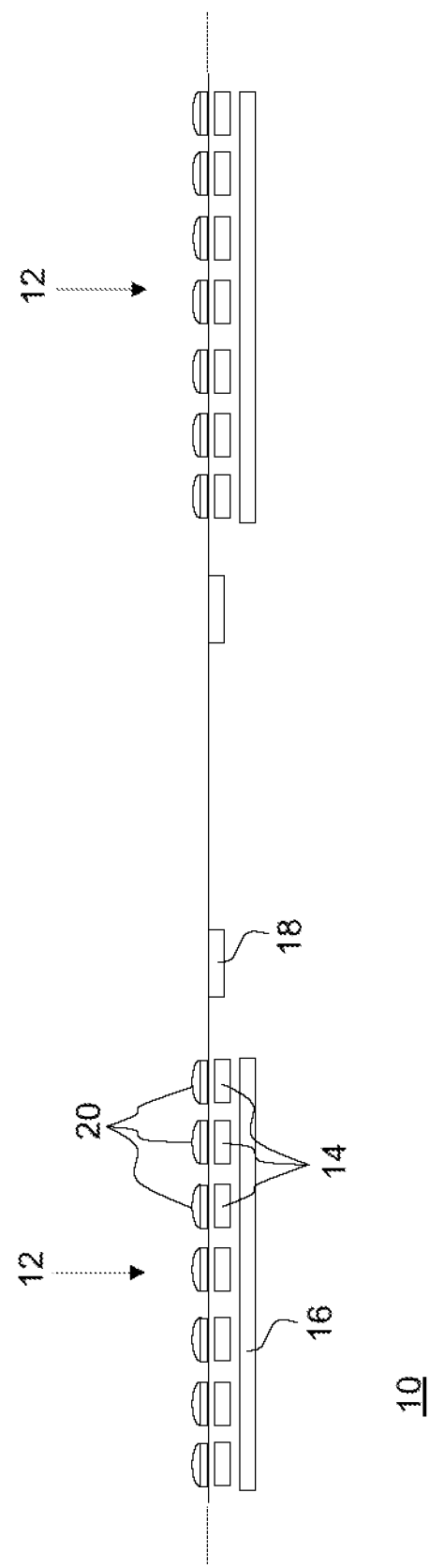

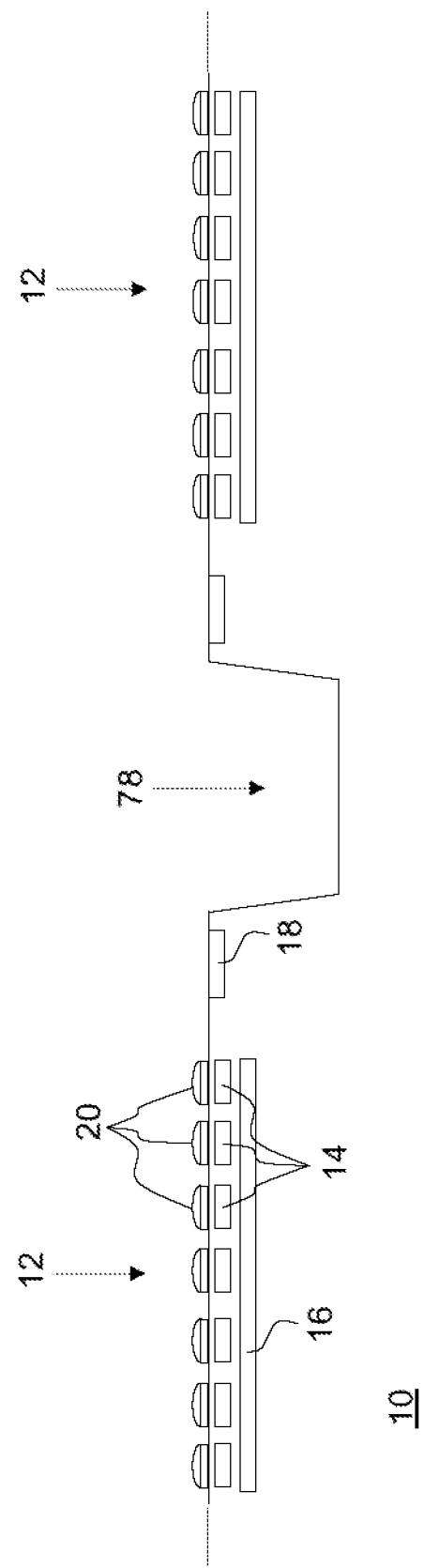

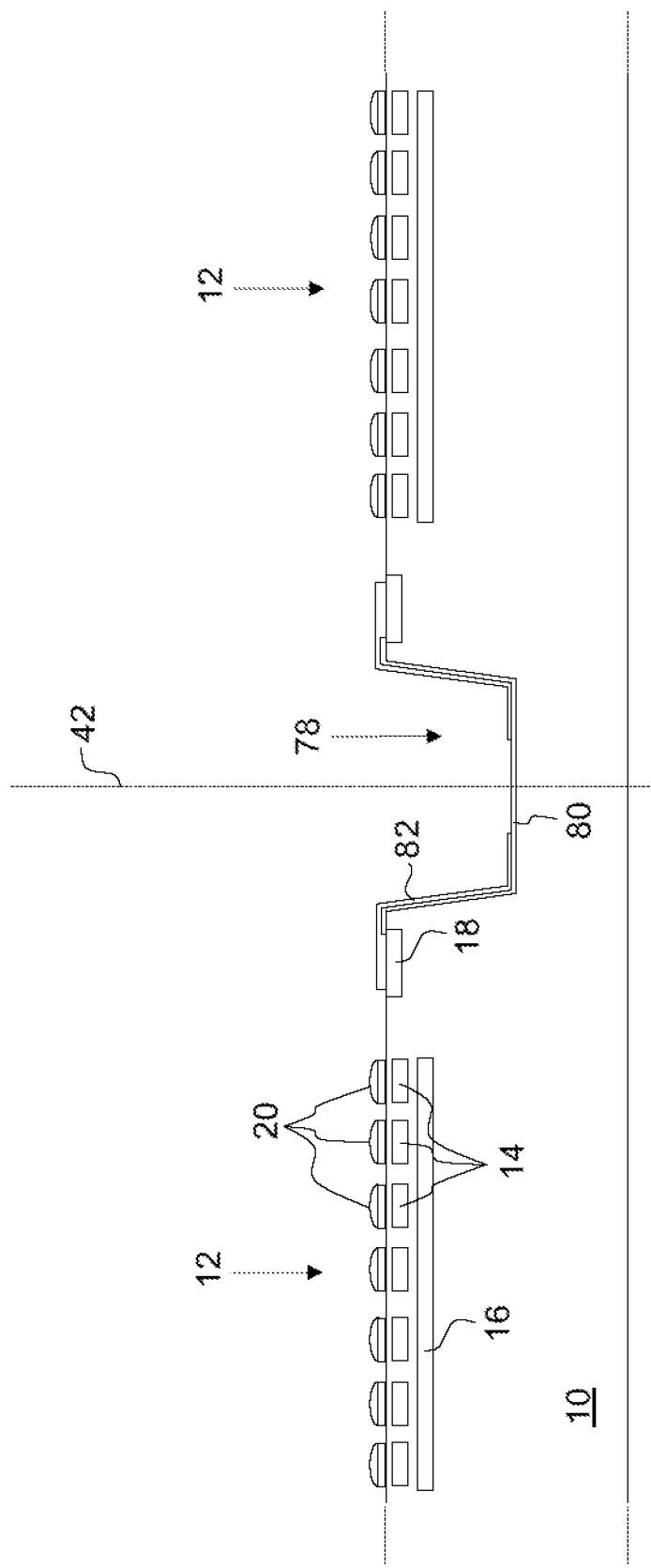

METHOD OF FORMING A LOW PROFILE IMAGE SENSOR PACKAGE WITH AN IMAGE SENSOR SUBSTRATE, A SUPPORT SUBSTRATE AND A PRINTED CIRCUIT BOARD

This application is a divisional of U.S. application Ser. No. 14/276,023 filed May 13, 2014, which is a divisional of U.S. application Ser. No. 13/609,002, filed Sep. 10, 2012.

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

There are different driving forces behind the development of wafer level packaging solutions for image sensors. For example, reduced form factor (i.e. increased density for achieving the highest capacity/volume ratio) overcomes space limitations and enables smaller camera module solutions. Increased electrical performance can be achieved with shorter interconnect lengths, which improves electrical performance and thus device speed, and which strongly reduces chip power consumption. Heterogeneous integration allows for the integration of different functional layers (e.g. the integration of high and low resolution images sensors, the integration of the image sensor with its processor, etc.).

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g. for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the capital investment for packaging 8 and 12 inch image sensor wafers. Additionally, standard WLP packages are fan-in packages, in which chip area is equal to the package area, thus limiting the number of I/O connections. Lastly, standard WLP package are bare die packages, which can be complex in test handling, assembly and SMT.

There is a need for an improved package and packaging technique that provides a low profile packaging solution that is cost effective and reliable (i.e. provides the requisite mechanical support and electrical connectivity).

BRIEF SUMMARY OF THE INVENTION

A method of forming an image sensor package includes providing a first substrate with opposing first and second surfaces and a plurality of image sensors formed thereon wherein each image sensor includes a plurality of photo detectors formed on or in the first substrate and a plurality of first contact pads formed at the first surface of the first substrate which are electrically coupled to the photo detectors, mounting a second substrate with opposing first and second surfaces to the first substrate by attaching the second substrate first surface to the first substrate first surface, forming trenches into the second substrate second surface that extends partially through the second substrate, wherein each of the trenches are disposed over one or more of the first contact pads, forming a plurality of openings each extending from one of the trenches to the second substrate first surface and exposing one of the first contact pads, forming a plurality of conductive traces each extending from one of the first contact pads and through one of the plurality of openings, dicing the mounted first and second substrates into multiple separate image sensor assemblies along dicing lines in-between the image sensors wherein each of the image sensor assemblies includes one of the image sensors, mounting one of the image sensor assemblies to a printed circuit board, wherein the printed circuit board includes a third substrate with opposing first and second surfaces, a cavity formed into the third substrate first surface, an opening extending from the cavity to the third substrate second surface, one or more circuit layers, and a plurality of second contact pads electrically coupled to the one or more circuit layers, wherein the first substrate of the one image sensor assembly is at least partially disposed in the cavity, and electrically connecting each of the plurality of conductive traces of the one image sensor assembly to one of the second contact pads.

Other objects and features of the present invention will become apparent by a review of the specification, claims and appended figures.

BRIEF DESCRIPTION OF THE DRAWINGS

FIGS. 1A-1J are cross sectional side views showing in sequence the steps in forming the image sensor assembly.

FIGS. 2A-2C are cross sectional side views showing in sequence the steps in packaging the image sensor assembly with a printed circuit board.

FIGS. 6A-6F are cross sectional side views showing in sequence the steps in forming an alternate embodiment of the packaged image sensor assembly.

DETAILED DESCRIPTION OF THE INVENTION

The present invention is a low profile, chip scale sensor module (e.g. for use in cameras) that incorporates a low profile wafer level wire bond or flip chip packaged image sensor, a printed circuit board with imaging window, and optics/camera lens module, assembled directly to the printed circuit board.

Figure 1C:
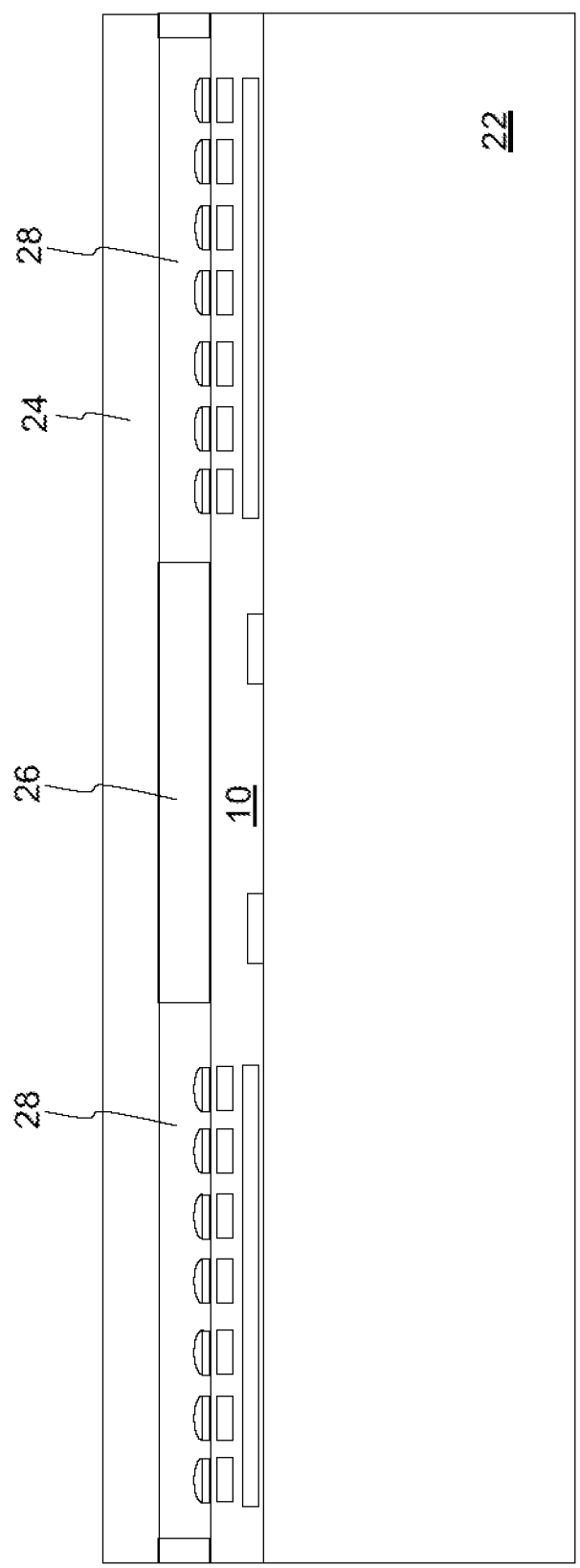

FIGS. 1A-1J and 2A-2C illustrates the formation of the packaged image sensor. The formation begins with a wafer 10 (substrate) containing multiple image sensors 12 formed thereon, as illustrated in FIG. 1A. Each image sensor 12 includes a plurality of photo detectors 14, supporting circuitry 16, and contact pads 18. Sensors 12 are commonly called BSI (back side illuminated) sensors because the photo detectors 14 are configured to detect and measure light entering from the back surface of the wafer 10 (i.e. the opposite surface to the front surface at which the circuitry 16 and contact pads 18 are formed). The contact pads 18 are electrically connected to the photo detectors 14 and/or their supporting circuitry 16 for providing off chip signaling. Each photo detector 14 converts light energy to a voltage signal. Additional circuitry may be included to amplify the voltage, and/or convert it to digital data. Color filters and/or microlenses 20 can be mounted over the photo detectors 14. Sensors of this type are well known in the art, and not further described herein.

The wafer 10 is first mounted to a support substrate 22, as illustrated in FIG. 1B. Substrate 22 is preferably made of silicon. An optically transparent protective substrate 24 is mounted over the back surface of the wafer 10 via spacers 26 that preserves an open space 28 between the wafer surface and the protective substrate 24. Optically transparent means transparent to at least those light wavelengths that will be detected/measured by photo detectors 14. Protective substrate 24 can be polymer, glass, a combination of glass and polymer or any other transparent material. As a non-limiting example, protective substrate is glass having a thickness of 100 μm to 1000 μm. Spacers 26 can be polymer, glass, silicon, epoxy or other material. A non-limiting example of the thickness of spacers 26 is between 5 μm and 30 μm.

Figure 1D:
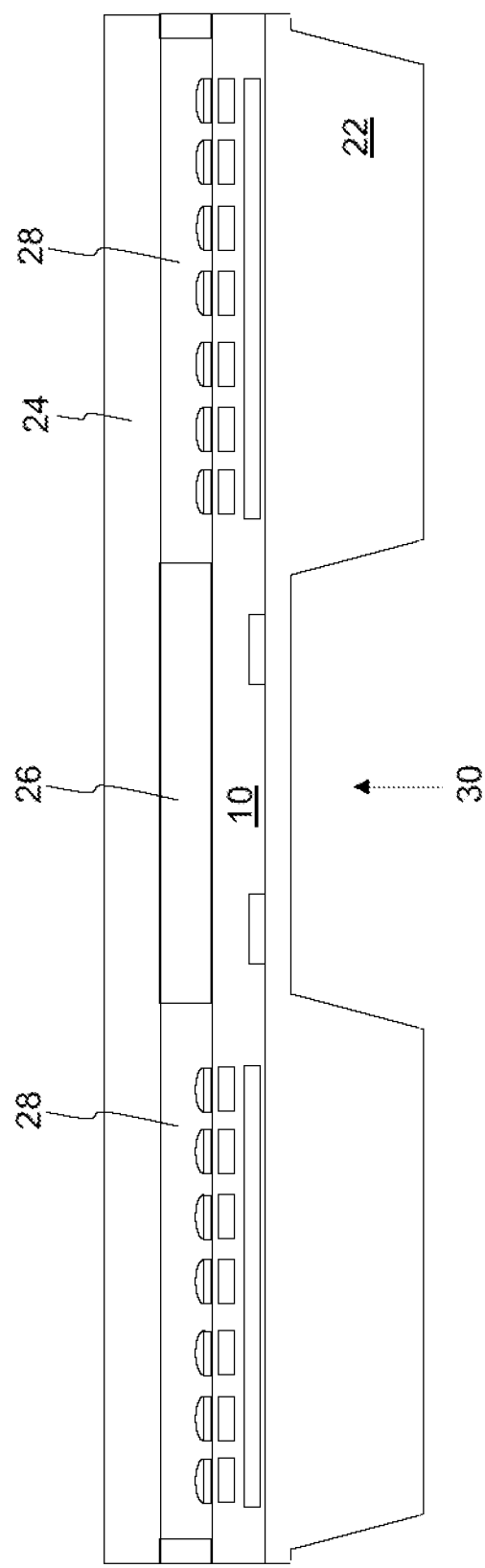
Figure 1E:
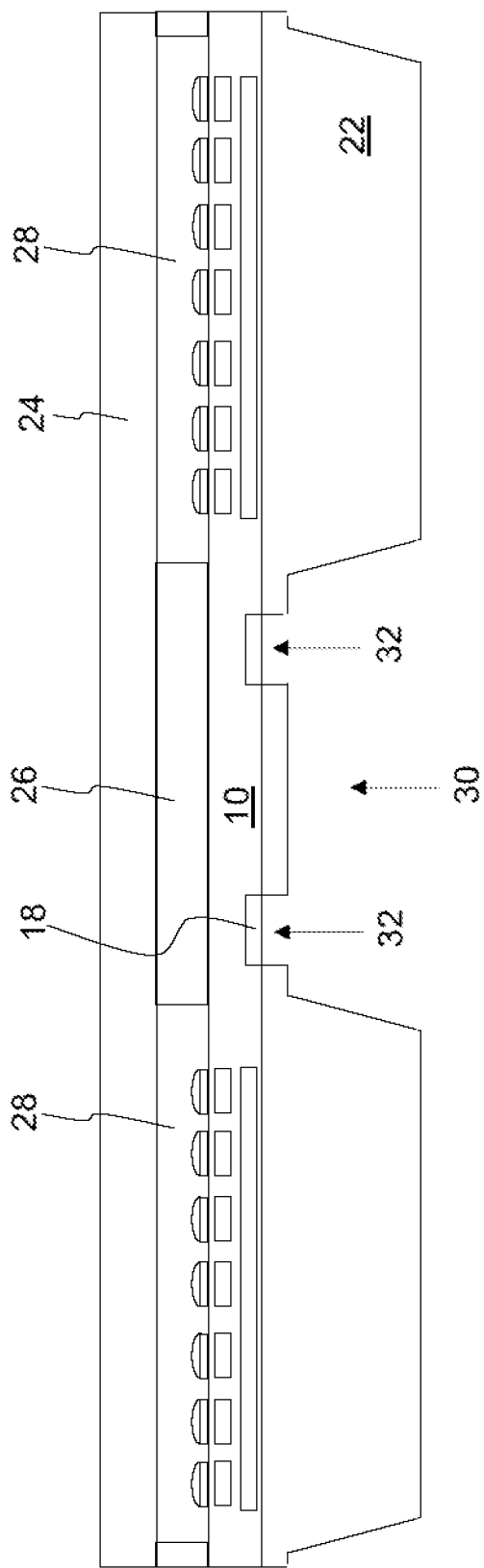

Preferably, the support substrate 22 is thinned by mechanical grinding or/and chemical etching of its bottom surface. The thickness of thinned support substrate 22 is preferably in the range of 100 to 400 μm. Trenches 30 are formed into the bottom surface of the support substrate 22, extending most but not all the way through substrate 22, as illustrated in FIG. 1D. Trenches 30 can be formed using conventional silicon etch techniques. Openings 32 extending from the trench to the top surface of the support substrate 22 are next formed to expose contact pads 18, as illustrated in FIG. 1E. Openings 32 can be formed using a laser or a combination of lithography and plasma etch or chemical etch method(s). The size of each opening 32 is preferably equal to or less than the size of the corresponding contact pad 18.

Figure 1F:
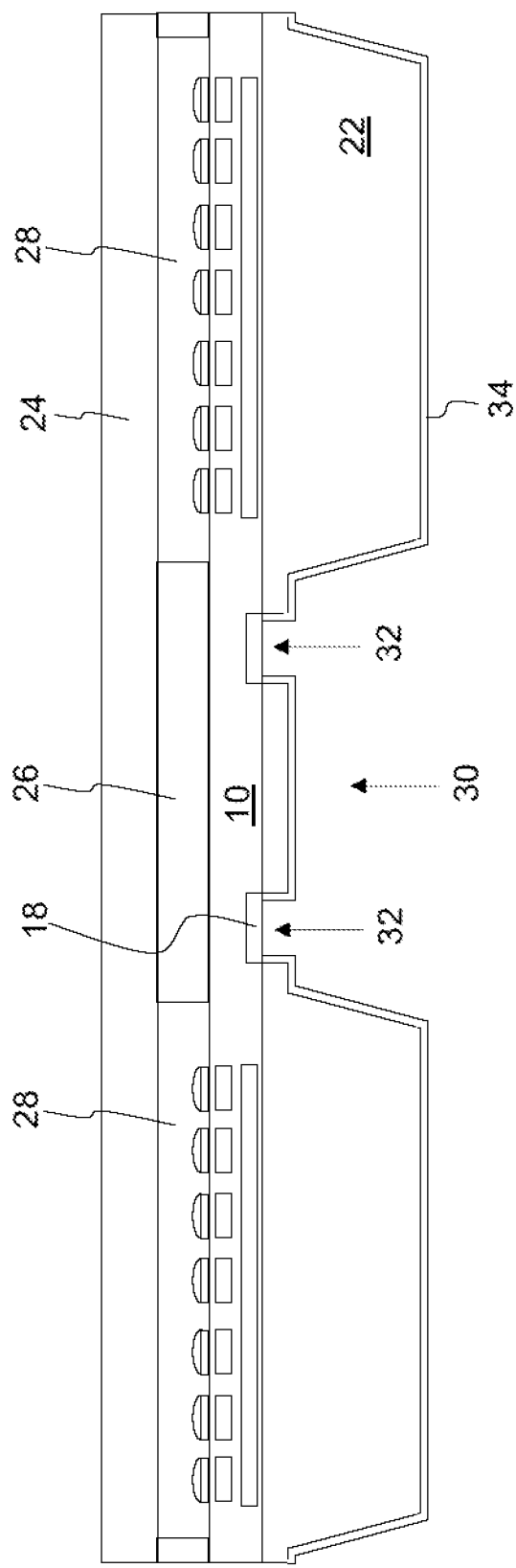

A layer of dielectric material 34 is deposited or formed on the bottom surface of support substrate 22, including on the side and bottom walls of trenches 30 and the side walls of openings 32, while leaving contact pads 18 exposed, as illustrated in FIG. 1F. Dielectric layer 34 can be silicon dioxide, silicon nitride, polymer, epoxy, polyimide, resin, metallic oxides or any other appropriate dielectric material(s). Preferably, dielectric is silicon dioxide, formed by thermal oxidation or deposited using sputtering or chemical vapor deposition techniques. A preferred thickness of dielectric layer 34 is 0.1 μm or greater. The formation of layer 34 may include depositing or forming the material over contact pads 18, followed by the selective removal of the material over contact pads 18.

Figure 1G:
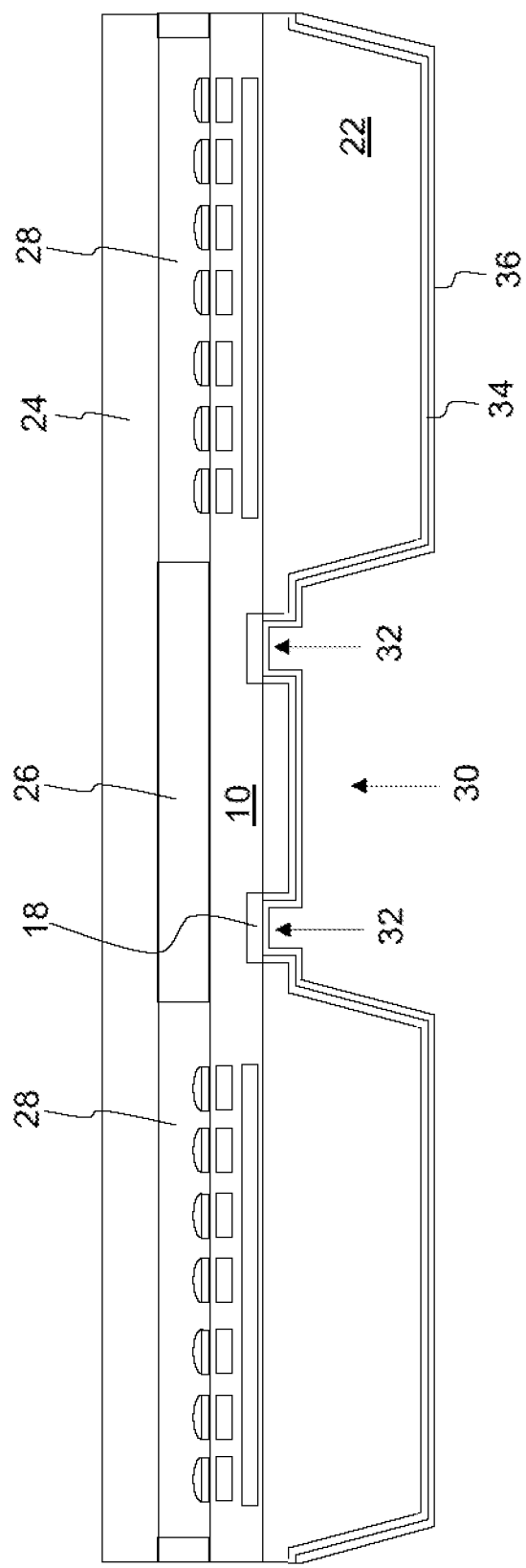
Figure 1H:
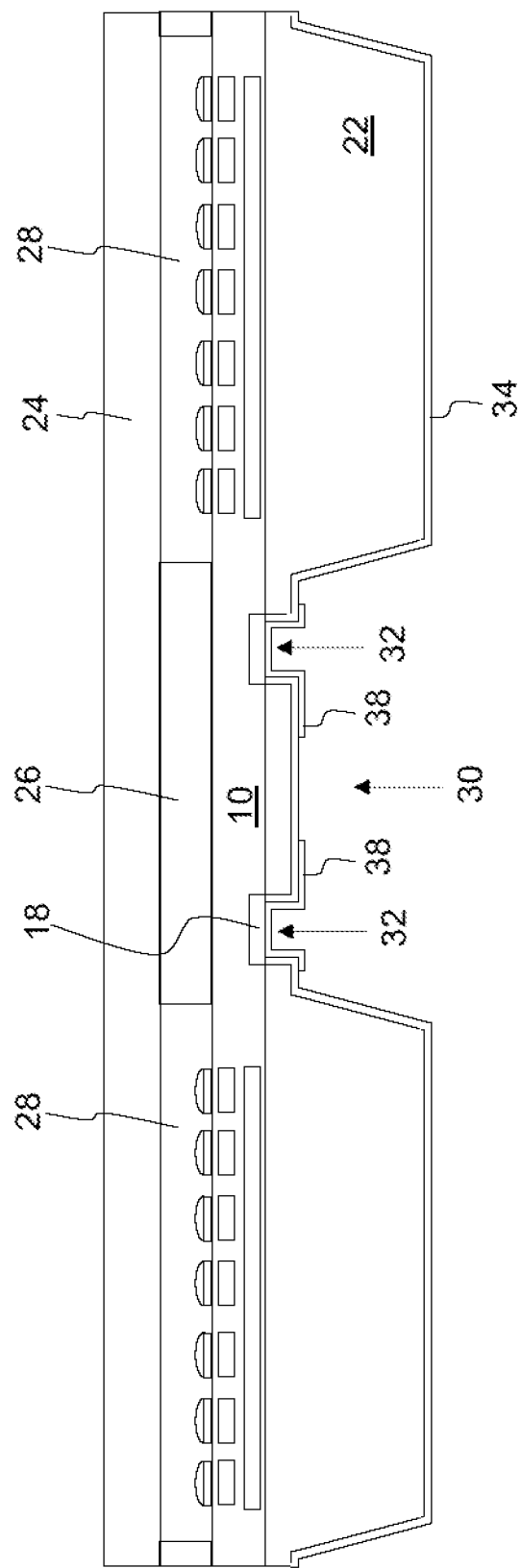

A layer of conductive material 36 is deposited or formed on the dielectric layer 34, including on contact pads 18, as illustrated in FIG. 1G. Conductive layer 36 can be copper, aluminum, polymer or any other appropriate electric conductive material(s). Conductive layer 36 can be deposited by electro plating, sputtering, chemical vapor deposition, screen printing or any other appropriate deposition method(s). A photo lithography process is used to selectively remove portions of conductive material 36, leaving conductive traces 38 of the conductive material 36 each of which extends from one of the contact pads 18, through opening 32, and to the bottom surface of the trench 30, as illustrated in FIG. 1H.

Figure 1J:
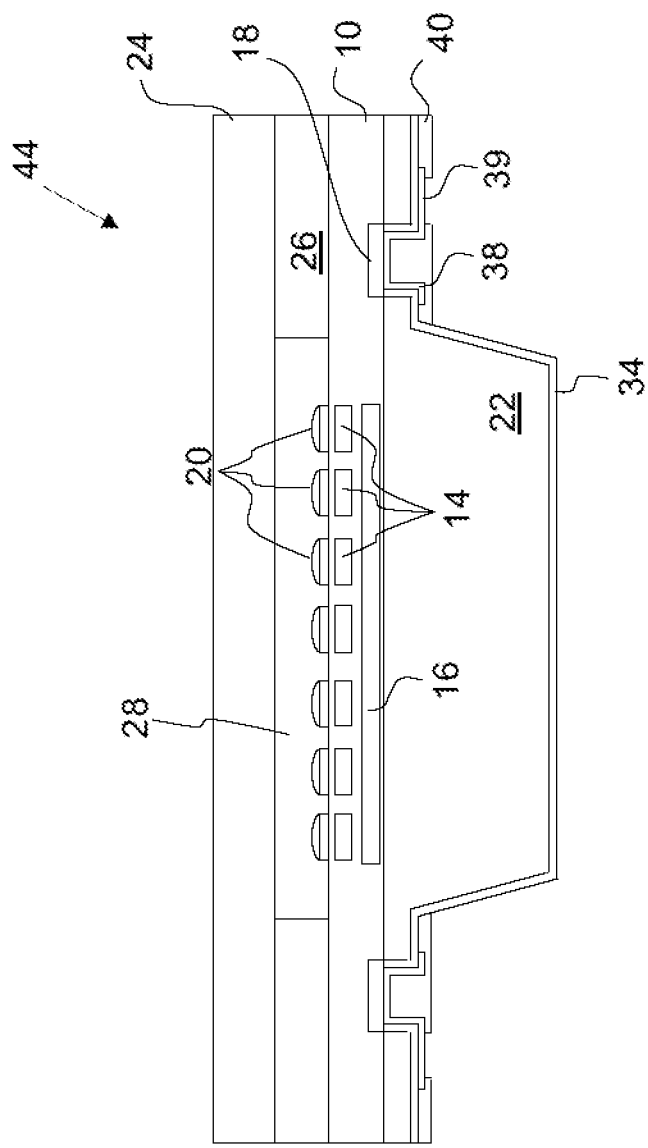

Dielectric material 40 is formed over traces 38 (encapsulating each trace) except for a select portion of each trace 38 (pad area 39) on the bottom surface of trench 30, as illustrated in FIG. 1I. Dielectric material 40 can be polymer, epoxy, metallic oxide, resin or any other appropriate encapsulant material(s). Material 40 is preferably at least 0.5 μm in thickness. Wafer 10 is then diced (singulated) along dicing lines 42, resulting in individual image sensor assemblies 44, as illustrated in FIG. 1J. Wafer dicing can be performed using mechnical blade dicing equipment, laser cutting or any other appropriate processes.

Image sensor assembly 44 can be mounted to a printed circuit board (PCB) 50 having the configuration shown in FIG. 2A. PCB 50 includes a substrate 52 on and/or in which one or more conductive PCB circuitry layers 54 are formed. PCB 50 includes contact pads 56 on its bottom surface, which are electrically coupled to the PCB circuitry layers 54, for off board signal communication. PCB circuitry layer(s) can include conductive traces, embedded circuit components, and/or other electronic components). PCB 50 includes an aperture 57 extending therethrough. Aperture 57 includes cavity 58 formed into the bottom surface of substrate 52, and an opening 60 extending between the cavity and the upper surface of substrate 52 to define a shoulder 61 (i.e. the opening 60 has a smaller lateral dimension than that of the cavity 58 to define laterally extending shoulder 61).

Figure 2B:
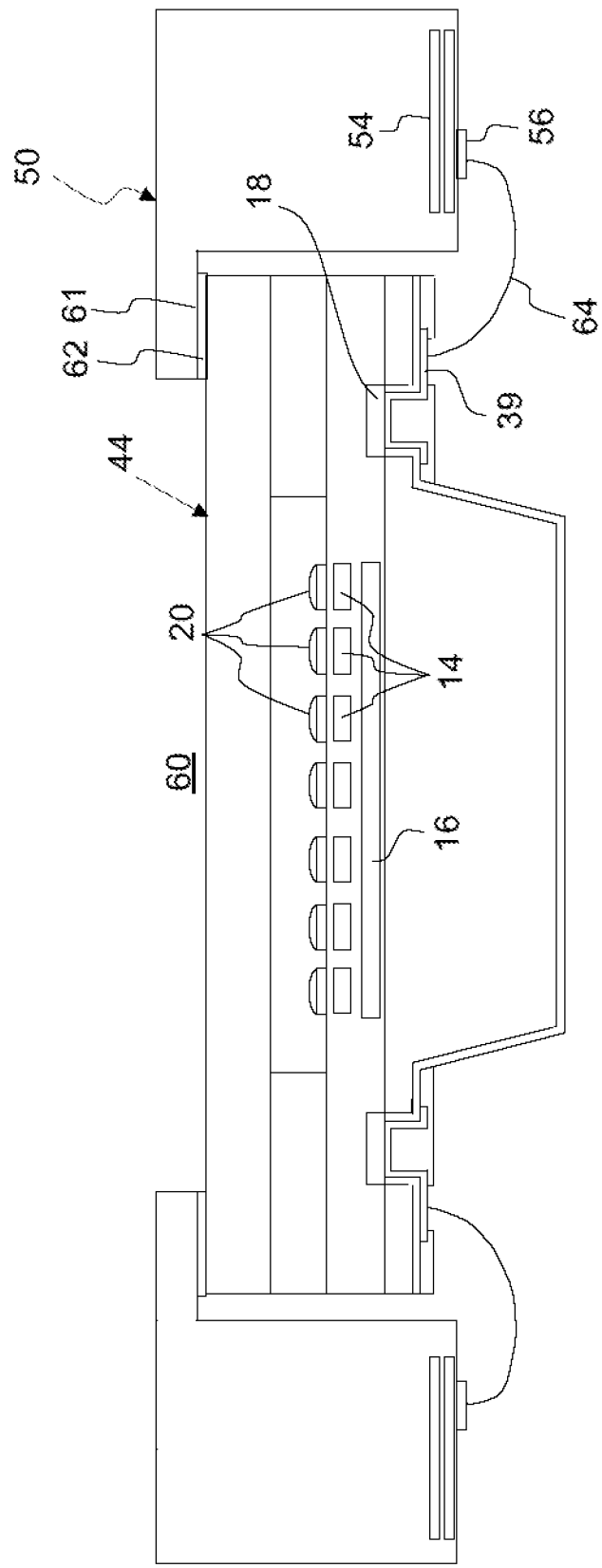

Image sensor assembly 44 is mounted inside cavity 58 of PCB 50, preferably to shoulder 61 with a layer of adhesive 62 having a thickness of 0.1 μm to 20 μm, such that photo detectors 14 are oriented to receive light passing through opening 60, as illustrated in FIG. 2B. A wire bonding process is then performed to form electrical connectors in the form of wires 64 between pad areas 39 and corresponding contact pads 56. Wires 64 can be alloyed gold, copper or any other appropriate wire bonding material, and are attached using any appropriate conventional wire bonding technique which are well known in the art.

Figure 2C:
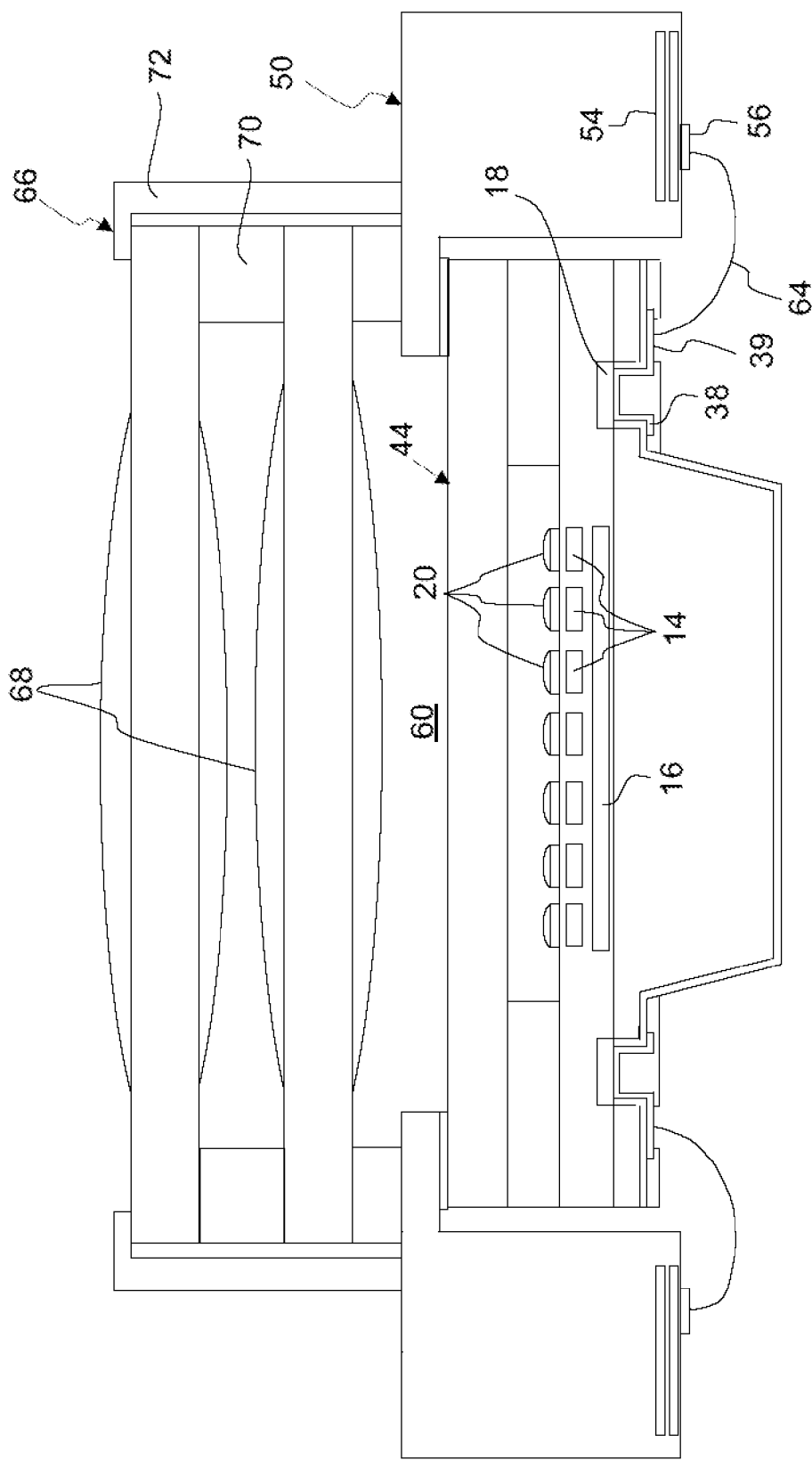

A lens module 66 is mounted to PCB 50 in a manner covering opening 60, as illustrated in FIG. 2C. Lens module 66 includes one or more optical lenses 68 separated by spacers 70 and mounted within a housing 72. The final image sensor package assembly is illustrated in FIG. 2C. Incoming light is focused by lens module 66, focused and filtered by color filters/microlenses 20, and detected/measured by photo detectors 14. Signals generated by photo detectors 14 are processed or conveyed by supporting circuitry 16, and provided to contact pads 18. The signals travel from contact pads 18, travel through traces 38, through wires 64, through contact pads 56 and through PCB circuitry layers 54. The lens module 66 protects the upper surface of image sensor assembly 44, and PCB 50 provides mechanical support and electrical signal connectivity for image sensor assembly 44.

Figure 3:
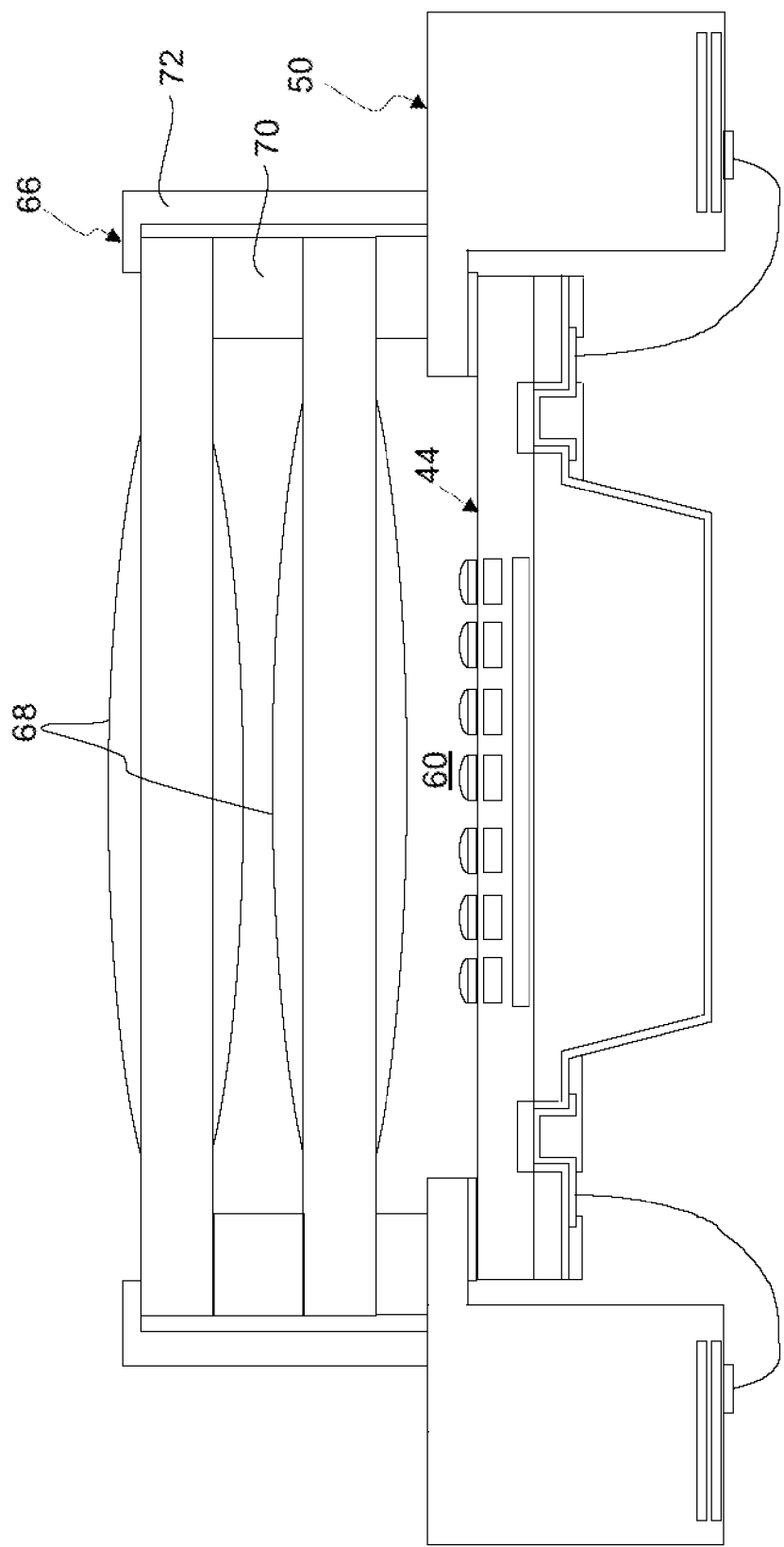
FIG. 3 is a cross sectional side view showing a first alternate embodiment.

FIG. 3 illustrates an alternate embodiment to that of FIG. 2C, where substrate 24 and spacers 26 are omitted from image sensor assembly 44, and the top surface of wafer 10 is mounted directly to shoulder 61. During assembly, protective tape can be placed on the upper surface of wafer 10 instead of substrate 24 and spacers 26, and removed after dicing.

Figure 4:
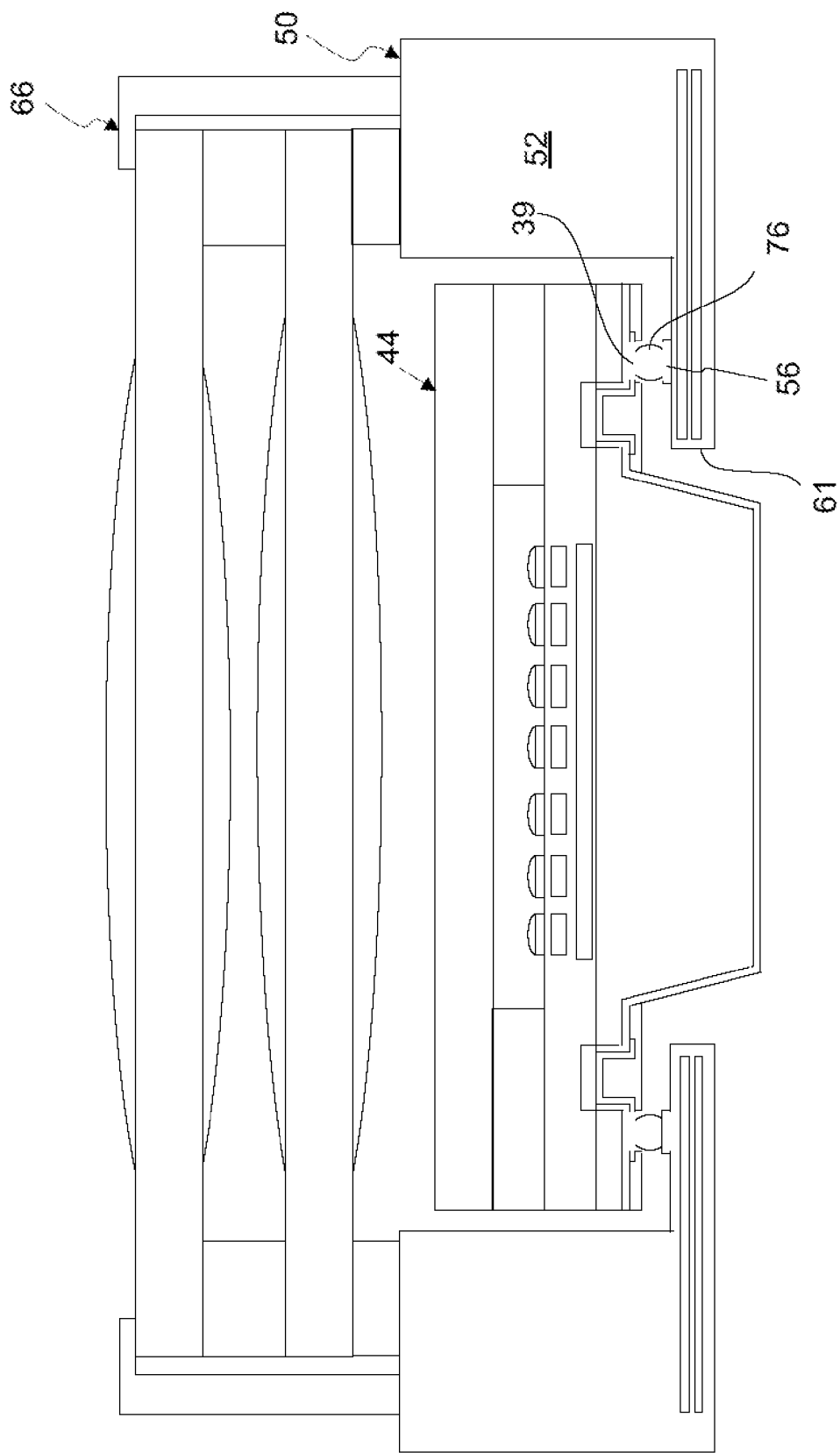
FIG. 4 is a cross sectional side view showing a second alternate embodiment.

FIG. 4 illustrates a second alternative embodiment, where a flip chip connection between the image sensor assembly 44 and the PCB 50 is utilized. In this embodiment, the orientation of PCB 50 is reversed (cavity 58 is formed into the top surface of substrate 52, and opening 60 extends between cavity 58 and the bottom surface of substrate 52). Contact pads 56 are formed on the shoulder 61. The image sensor assembly is inserted into cavity 58 such that Ball Grid Array (BGA) or Land Grid Array electrical connectors 76 make electrical contact between corresponding pad areas 39 and contact pads 56. Electrical connectors 76 also mechanically secure image sensor assembly 44 to PCB 50.

Figure 5:
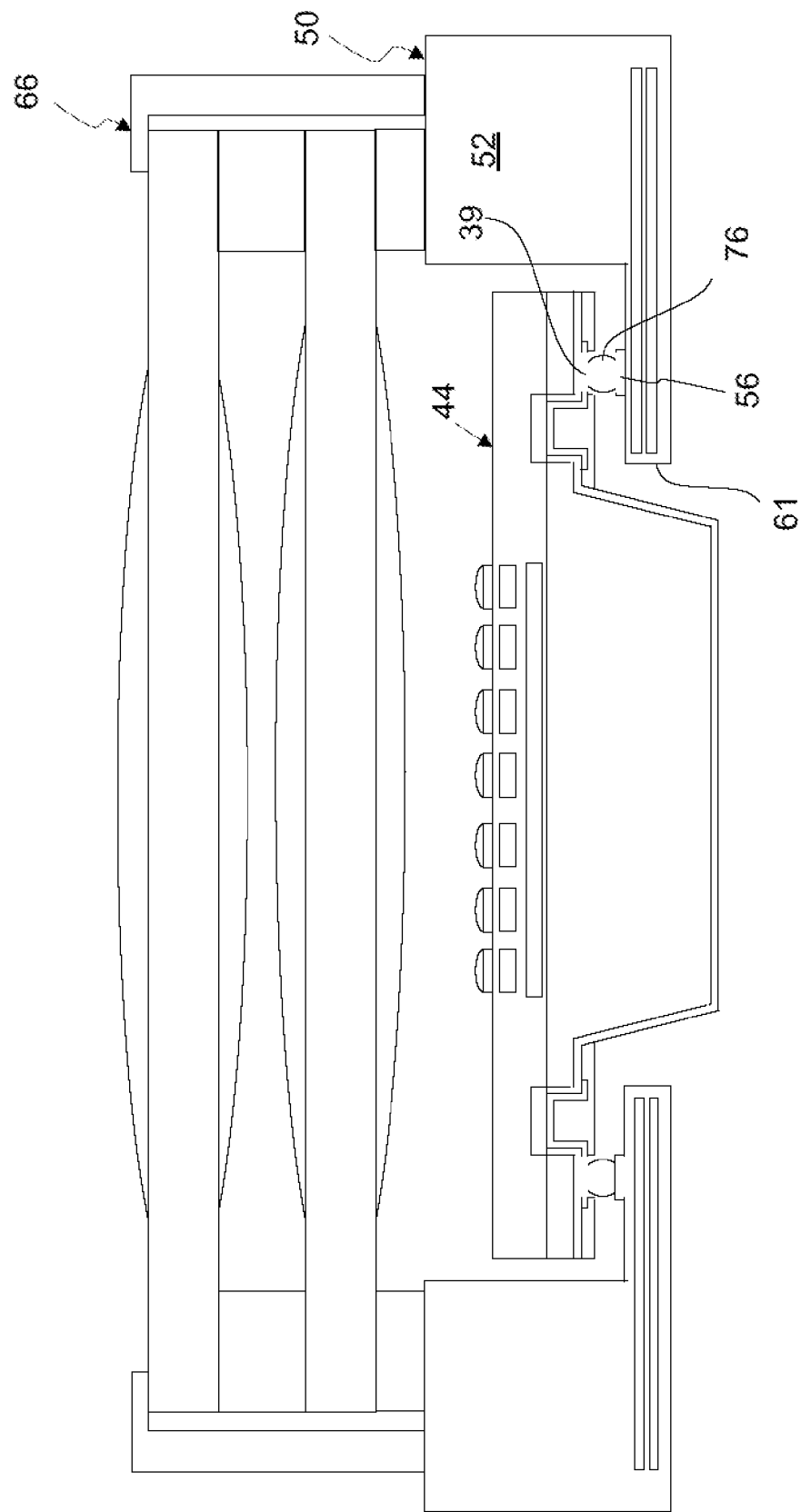
FIG. 5 is a cross sectional side view showing a third alternate embodiment.

FIG. 5 illustrates an alternate embodiment to that of FIG. 4, where substrate 24 and spacers 26 are omitted from image sensor assembly 44. During assembly, protective tape can be placed on the upper surface of wafer 10 instead of substrate 24 and spacers 26, and removed after dicing.

FIGS. 6A-6F illustrate the formation of the packaged image sensor according to another alternate embodiment. This embodiment utilizes image sensors 12 which are FSI (front surface illuminated) sensors (i.e. the photo detectors are configured to detect and measure light entering from the front surface of the wafer 10, which is the same surface at which the circuitry 16 and contact pads 18 are formed). With FSI image sensors, wafer 10 can be thick enough to negate the need for attaching a separate support substrate (because increased wafer thickness will not adversely affect the detected light, which is no longer traveling through the substrate from the back surface to reach the photo detectors).

FIG. 6A illustrates FSI image sensors 12 formed on substrate 10. Trenches 78 are formed into the front surface of the wafer 10 between adjacent image sensors 12, as illustrated in FIG. 6B. A layer of dielectric material 80 is deposited or formed on the side and bottom walls of trenches 78 and on the front surface of wafer 10 up to but not over contact pads 18. Dielectric layer 80 can be formed using the same technique and material(s) as dielectric layer 34 described previously. Conductive traces 82 (of conductive material) are formed on the dielectric layer 80 in trenches 78 and on portions of the front surface of wafer 10, including on contact pads 18, in a similar manner as conductive traces 38. Each conductive trace 82 extends from one of the contact pads 18, into one of the trenches 78 and to the bottom surface of trench 78. The resulting structure is illustrated in FIG. 6C.

Figure 6D:
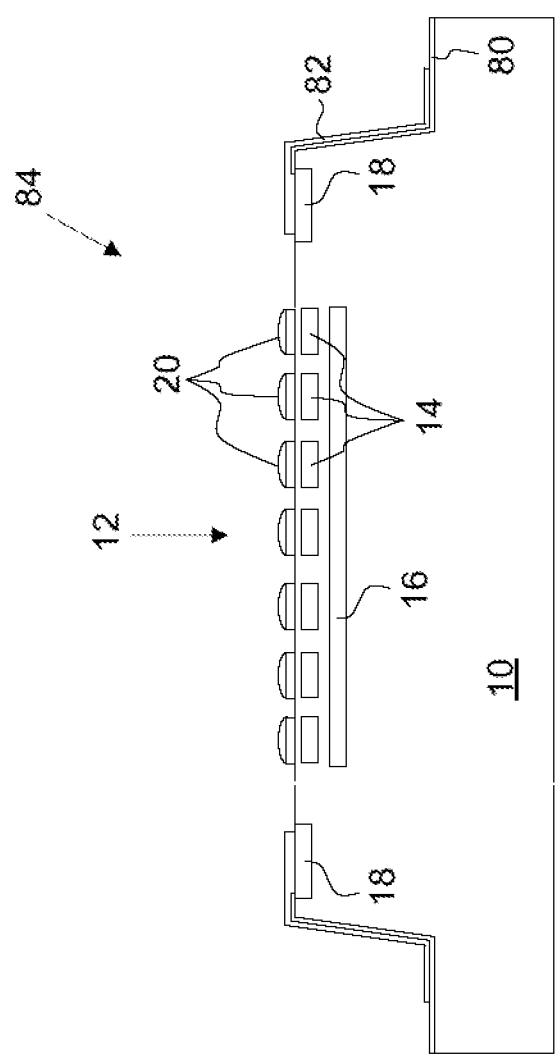
Figure 6E:
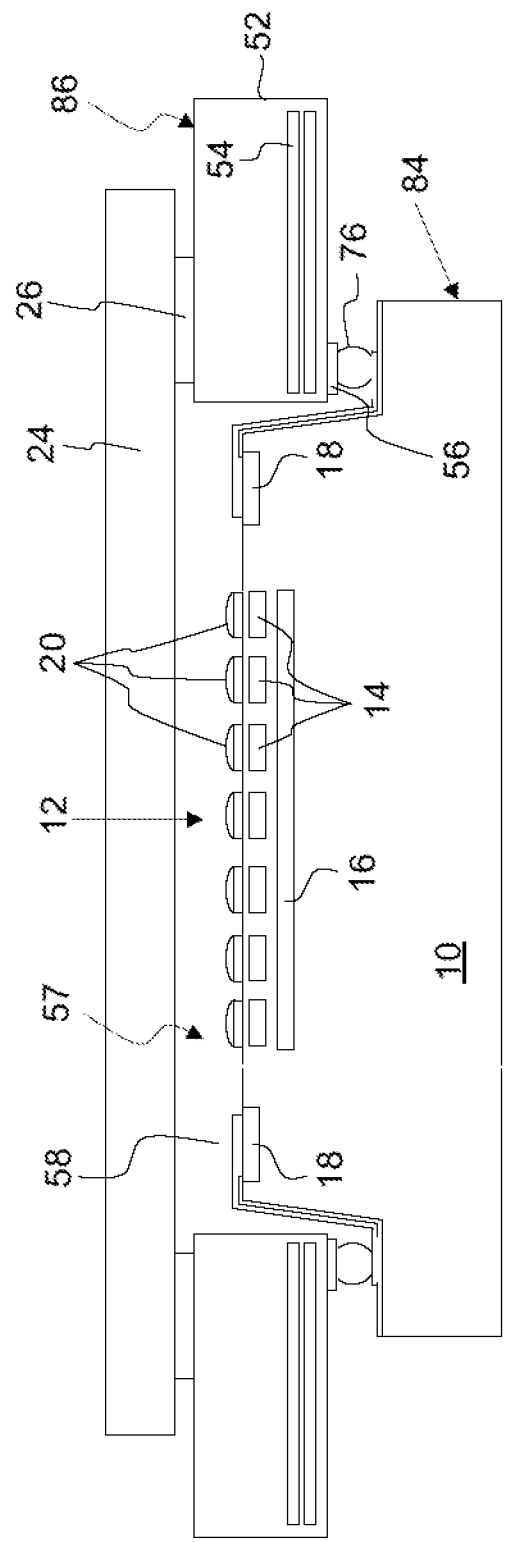

Wafer 10 is then diced (singulated) along dicing lines 42, resulting in individual image sensor assemblies 84, as illustrated in FIG. 6D. Image sensor assemblies 84 are then mounted to a printed circuit board (PCB) 86, as illustrated in FIG. 6E. PCB 86 is the same configuration as PCB 50 described above, except that aperture 57 includes cavity 58 that extends entirely through substrate 52 (i.e. no shoulder 61). A flip-chip connection between the image sensor assembly 84 and PCB 86 is utilized, where Ball Grid Array (BGA) or Land Grid Array electrical connectors 76 make electrical contact between corresponding traces 82 and PCB contact pads 56. Electrical connectors 76 also mechanically secure image sensor assembly 84 to PCB 86. Transparent protective substrate 24 is mounted to PCB 86, and lens module 66 is mounted to protective substrate 24, as previously described. The final structure is illustrated in FIG. 6F.

Figure 6F:
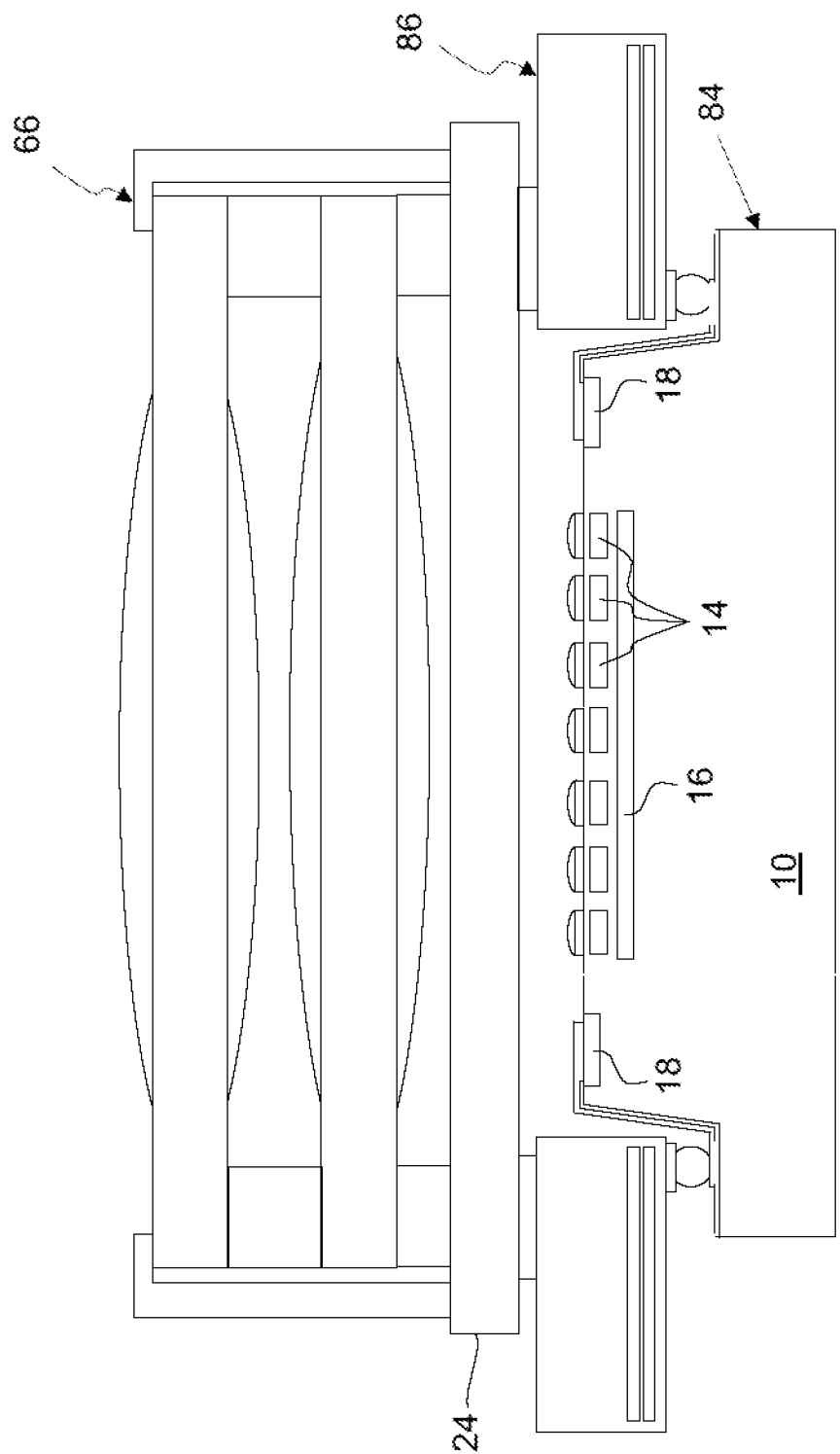
Figure 7:
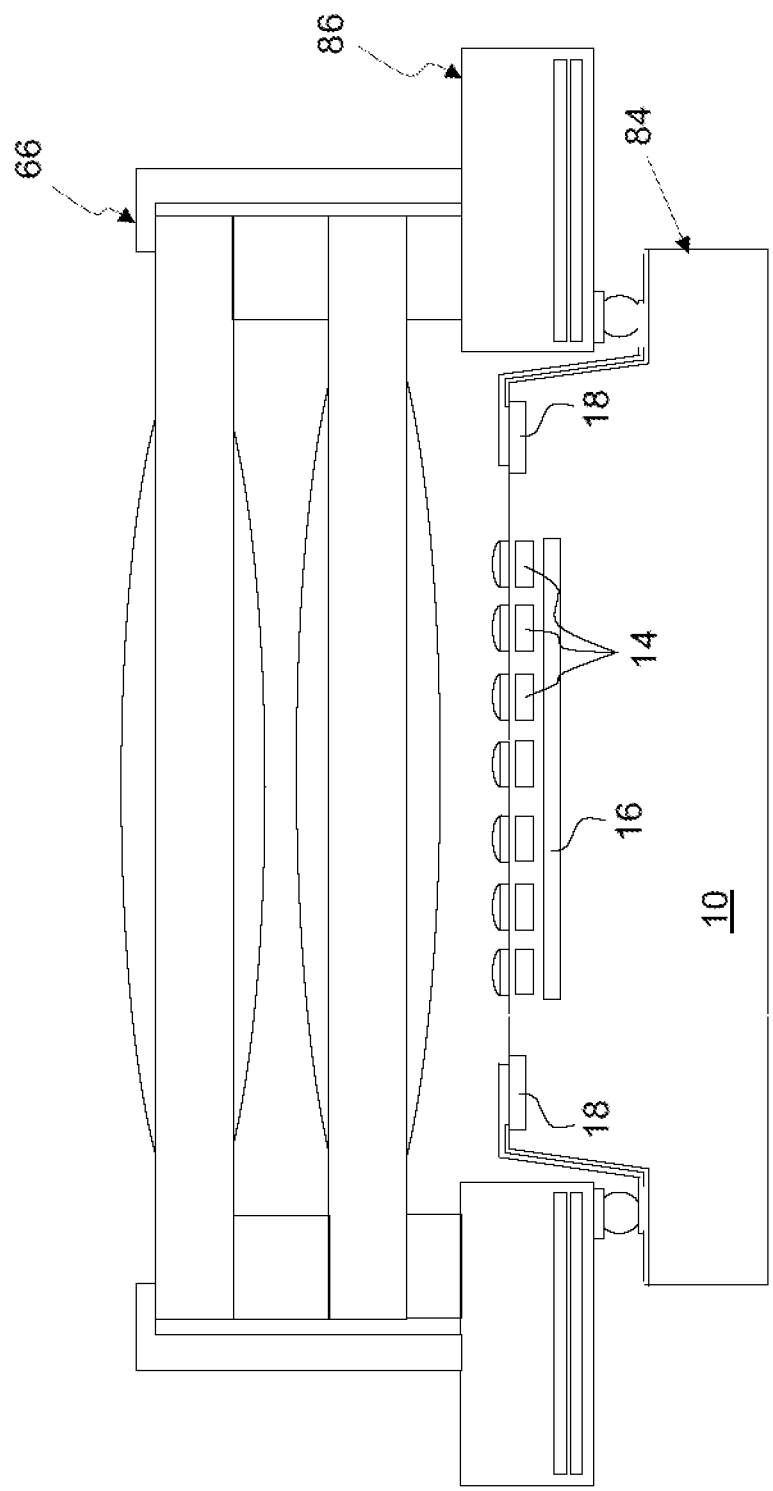
FIG. 7 is a cross sectional side view showing an alternate embodiment of that of FIG. 6F.

FIG. 7 illustrates an alternate embodiment to that of FIG. 6F, where substrate 24 and spacers 26 are omitted, and lens module 66 is mounted directly to PCB 86.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the image sensor packaging of the present invention. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming an image sensor package, comprising:
    providing a first substrate with opposing first and second surfaces and a plurality of image sensors formed thereon, wherein each image sensor includes a plurality of photo detectors formed on or in the first substrate and a plurality of first contact pads formed at the first surface of the first substrate which are electrically coupled to the photo detectors;
    mounting a second substrate with opposing first and second surfaces to the first substrate by attaching the second substrate first surface to the first substrate first surface;
    forming trenches into the second substrate second surface that extends partially through the second substrate, wherein each of the trenches is disposed over one or more of the first contact pads;
    forming a plurality of openings each extending from one of the trenches to the second substrate first surface and exposing one of the first contact pads;
    forming a plurality of conductive traces each extending from one of the first contact pads and through one of the plurality of openings;
    dicing the mounted first and second substrates into multiple separate image sensor assemblies along dicing lines in-between the image sensors, wherein each of the image sensor assemblies includes one of the image sensors;
    mounting one of the image sensor assemblies to a printed circuit board, wherein the printed circuit board includes a third substrate with opposing first and second surfaces, a cavity formed into the third substrate first surface, an opening extending from the cavity to the third substrate second surface, one or more circuit layers, and a plurality of second contact pads electrically coupled to the one or more circuit layers, wherein the first substrate of the one image sensor assembly is at least partially disposed in the cavity; and
    electrically connecting each of the plurality of conductive traces of the one image sensor assembly to one of the second contact pads.

2. The method of claim 1, wherein the printed circuit board includes a laterally extending shoulder at the second surface of the third substrate such that the opening has a smaller lateral dimension than that of the cavity.

3. The method of claim 2, further comprising:
mounting a lens module to the printed circuit board, wherein the lens module includes one or more lenses disposed for focusing light onto the photo detectors.

4. The method of claim 2, wherein the mounting includes mounting the one image sensor assembly to the shoulder via adhesive, and wherein the plurality of photo detectors are oriented to receive light passing through the opening.

5. The method of claim 3, wherein the lens module is mounted to the second surface of the third substrate, and disposed over the opening.

6. The method of claim 2, wherein the plurality of second contact pads are disposed at the first surface of the third substrate.

7. The method of claim 4, further comprising:
mounting an optically transparent substrate to and spaced from the first substrate second surface of the one image sensor assembly, wherein the adhesive is disposed directly between the optically transparent substrate and the shoulder.

8. The method of claim 2, wherein the adhesive is disposed directly between the first substrate second surface of the one image sensor assembly and the shoulder.

9. The method of claim 2, wherein:
the plurality of second contact pads are disposed at the shoulder of the third substrate;
the electrically connecting includes using Ball Grid Array (BGA) or Land Grid Array electrical connectors.

10. The method of claim 9, further comprising:
mounting an optically transparent substrate to and spaced from the first substrate second surface of the one image sensor assembly.

\* \* \* \* \*